United States Patent
Yu et al.

(10) Patent No.: US 11,283,067 B2
(45) Date of Patent: Mar. 22, 2022

(54) METHOD FOR PREPARING ELECTRODE MATERIAL, ELECTRODE MATERIAL, AND BATTERY

(71) Applicant: HUAWEI TECHNOLOGIES CO., LTD., Guangdong (CN)

(72) Inventors: Zhexun Yu, Shenzhen (CN); Yangxing Li, Shenzhen (CN)

(73) Assignee: Huawei Technologies Co., Ltd., Shenzhen (CN)

(*) Notice: Subject to any disclaimer, the term of this patent is extended or adjusted under 35 U.S.C. 154(b) by 105 days.

(21) Appl. No.: 16/586,478

(22) Filed: Sep. 27, 2019

(65) Prior Publication Data
US 2020/0028163 A1    Jan. 23, 2020

Related U.S. Application Data

(63) Continuation of application No. PCT/CN2017/090377, filed on Jun. 27, 2017.

(30) Foreign Application Priority Data

Mar. 31, 2017 (CN) .......................... 201710209622.9

(51) Int. Cl.
*H01M 4/36* (2006.01)
*H01M 4/1393* (2010.01)
(Continued)

(52) U.S. Cl.
CPC ......... *H01M 4/366* (2013.01); *H01M 4/1393* (2013.01); *H01M 4/1395* (2013.01);
(Continued)

(58) Field of Classification Search
CPC .. H01M 4/366; H01M 4/1393; H01M 4/1395; H01M 4/587; H01M 2004/027
See application file for complete search history.

(56) References Cited

U.S. PATENT DOCUMENTS

| | | |
|---|---|---|
| 2011/0033746 A1 | 2/2011 | Liu et al. |
| 2013/0089784 A1 | 4/2013 | Cho et al. |

(Continued)

FOREIGN PATENT DOCUMENTS

| | | |
|---|---|---|
| CN | 103107335 A | 5/2013 |
| CN | 103594677 A | 2/2014 |

(Continued)

OTHER PUBLICATIONS

Zhao et al., "Layered amorphous silicon as negative electrodes in lithium-ion batteries" Journal of Power Sources, Journal of Power Sources 332, Sep. 29, 2016, 9 pages.

(Continued)

*Primary Examiner* — Amanda C. Walke
(74) *Attorney, Agent, or Firm* — Fish & Richardson P.C.

(57) ABSTRACT

A method for preparing an electrode material, an electrode material, and a battery are provided to resolve a prior-art problem that a silicon negative electrode material in a battery is prone to pulverization in a fully intercalated state. The electrode material includes a layered silicon core and graphene quantum dots. The layered silicon core includes at least two layers of silicon-based materials, an interlayer gap exists between two neighboring layers of the at least two layers of silicon-based materials, and the silicon-based material includes at least one of silicon or an oxide of silicon. The graphene quantum dots are located in the interlayer gap between the at least two layers of silicon-based materials.

12 Claims, 3 Drawing Sheets

Layered silicon core 10

(51) Int. Cl.
   *H01M 4/1395* (2010.01)
   *H01M 4/38* (2006.01)
   *H01M 4/587* (2010.01)
   *H01M 4/02* (2006.01)

(52) U.S. Cl.
   CPC ........... *H01M 4/386* (2013.01); *H01M 4/587* (2013.01); *H01M 2004/027* (2013.01)

(56) References Cited

U.S. PATENT DOCUMENTS

| | | |
|---|---|---|
| 2014/0050983 A1 | 2/2014 | Kim et al. |
| 2014/0147751 A1 | 5/2014 | Yang et al. |
| 2015/0004494 A1 | 1/2015 | Tatsuhiro et al. |
| 2017/0012282 A1 | 1/2017 | Kondo et al. |
| 2017/0256792 A1 | 9/2017 | Kondo et al. |
| 2021/0081777 A1* | 3/2021 | Thomas ................ H01L 31/112 |

FOREIGN PATENT DOCUMENTS

| | | |
|---|---|---|
| CN | 104253266 A | 12/2014 |
| CN | 102157731 B | 3/2015 |
| CN | 104528737 A | 4/2015 |
| CN | 105336923 A | 2/2016 |
| CN | 105960726 A | 9/2016 |
| CN | 104185917 B | 11/2016 |
| CN | 106410156 A | 2/2017 |
| CN | 106784700 A | 5/2017 |
| CN | 104979536 B | 5/2018 |
| JP | 2016110897 A | 6/2016 |
| KR | 20130016727 A | 2/2013 |
| KR | 20130037090 A | 4/2013 |
| KR | 20140022682 A | 2/2014 |
| KR | 101396521 B1 | 5/2014 |
| WO | 2016031126 A1 | 3/2016 |

OTHER PUBLICATIONS

PCT International Search Report and Written Opinion in International Application No. PCT/CN2017/090,377, dated Sep. 7, 2017, 17 pages (With English Translation).

Extended European Search Report issued in European Application No. 17903184.4 dated Mar. 17, 2020, 7 pages.

Xu et al., "Silicon-based nanosheets synthesized by a topochemical reaction for use as anodes for lithium ion batteries," Nano Research, vol. 8, No. 8, XP055633295, Aug. 1, 2015, pp. 2654-2662.

* cited by examiner

METHOD FOR PREPARING ELECTRODE MATERIAL, ELECTRODE MATERIAL, AND BATTERY

CROSS-REFERENCE TO RELATED APPLICATIONS

This application is a continuation of International Application No. PCT/CN2017/090377, filed on Jun. 27, 2017, which claims priority to Chinese Patent Application No. 201710209622.9, filed on Mar. 31, 2017. The disclosures of the aforementioned applications are hereby incorporated by reference in their entireties.

TECHNICAL FIELD

This application relates to the field of material technologies, and in particular, to a method for preparing an electrode material, an electrode material, and a battery.

BACKGROUND

A lithium-ion battery usually uses graphite as a negative electrode material. A theoretical capacity per gram of graphite is 372 mAh/g, but a capacity per gram of currently actually used graphite has exceeded 360 mAh/g, and is close to a theoretical limit value. Consequently, there is hardly space for increase of the capacity per gram of graphite. This restricts further improvement of energy density of the battery.

A theoretical capacity per gram of silicon is far greater than that of graphite, and reaches 4200 mAh/g, so that silicon is very likely to be used as a negative electrode material of a battery. However, when a silicon negative electrode is in a full lithium intercalated state, a volume expansion is up to 300% to 400%. As a result, a solid electrolyte interface (SEI) film is broken, and a silicon negative electrode material is pulverized, greatly reducing a cycle life.

SUMMARY

This application provides a method for preparing an electrode material, an electrode material, and a battery to resolve a prior-art problem that a silicon negative electrode material in a battery is prone to pulverization in a fully intercalated state.

According to a first aspect, an embodiment of this application provides an electrode material, including a layered silicon core and graphene quantum dots. The layered silicon core includes at least two layers of silicon-based materials, an interlayer gap exists between two neighboring layers of the at least two layers of silicon-based materials, and the silicon-based material includes at least one of silicon or an oxide of silicon. For example, the silicon-based material may be any one of silicon, silicon dioxide, or silicon monoxide; or the silicon-based material includes two of silicon, silicon dioxide, and silicon monoxide, or includes all of silicon, silicon dioxide, and silicon monoxide. The graphene quantum dots are located in the interlayer gap of the layered silicon core.

When being used as a negative electrode of a battery, the electrode material in this embodiment can effectively suppress expansion pressure of a negative electrode material during lithium intercalation by using the interlayer gap of the layered silicon core, thereby reducing a volume change of the negative electrode material of the battery in charging and discharging processes, and improving a service life of the negative electrode material of the battery. In addition, the graphene quantum dots are filled in the interlayer gap of the layered silicon core. The graphene quantum dots are used to support layers of the silicon core to improve strength of the layered silicon core and prevent structural collapse of the layered silicon core after repeated expansion and contraction. Moreover, the graphene quantum dots have superior conductivity, which also helps transmission of electrons and can improve conductivity of the electrode material.

In an optional embodiment of the first aspect, the graphene quantum dots are further located on an outer surface of the layered silicon core. The graphene quantum dots on the outer surface of the layered silicon core can further improve conductivity of the layered silicon core, and malleability of the graphene quantum dots can also excellently cushion expansion of the layered silicon core.

In an optional embodiment of the first aspect, the electrode material further includes a coating layer, coated on the outer surface of the layered silicon core. The coating layer may be an amorphous carbon coating layer; or may be an inorganic compound coating layer, such as a lithium titanate coating layer; or may be an organic coating layer, such as a polyaniline coating layer. The coating layer prepared on the outer surface of the layered silicon core can solidify the layered silicon core, and be used to avoid direct contact between the layered silicon core and an electrolyte, thereby reducing a side reaction, preventing silicon pulverization in a long-term cycle process, and further improving cycle performance. In addition, when the coating layer is a carbon coating layer, a stable graphitized interface may further be provided, and more lithium ion deintercalation channels may be provided, to reduce electrochemical reaction impedance of the interface, reduce a quantity of negative electrode film forming additives, and improve power performance.

In an optional embodiment of the first aspect, the graphene quantum dots are located in the interlayer gap and an outer surface of the layered silicon core. The electrode material further includes a coating layer, coated on the outer surface of the layered silicon core. The graphene quantum dots located on the outer surface of the layered silicon core are also coated by the coating layer. In this embodiment, malleability of the graphene quantum dots on the surface of the layered silicon core can excellently cushion expansion of the layered silicon core. The coating layer can solidify the layered silicon core, and be used to avoid direct contact between the layered silicon core and an electrolyte, thereby reducing a side reaction, preventing silicon pulverization in a long-term cycle process, and further improving cycle performance. In addition, when the coating layer is a carbon coating layer, a stable graphitized interface may further be provided, and more lithium ion deintercalation channels may be provided, to reduce electrochemical reaction impedance of the interface, reduce a quantity of negative electrode film forming additives, and improve power performance.

According to a second aspect, an embodiment of this application provides an electrode material, including a layered silicon core and graphene quantum dots. The layered silicon core includes at least two layers of silicon-based materials, an interlayer gap exists between two neighboring layers of the at least two layers of silicon-based materials, and the silicon-based material includes at least one of silicon or an oxide of silicon. The graphene quantum dots are located on an outer surface of the layered silicon core. In this embodiment, when the electrode material is used as a negative electrode of a battery, a large quantity of interlayer gaps of the layered silicon core can be used to alleviate expansion pressure of the negative electrode in a lithium (or another ion released by a positive electrode of the battery) intercalated state, thereby reducing a volume change of the negative electrode of the battery in charging and discharging processes, effectively avoiding pulverization of the negative electrode of the battery, and improving a service life of the negative electrode of the battery. The graphene quantum dots on the outer surface of the layered silicon core can improve conductivity of the layered silicon core, and malleability of the graphene quantum dots can also excellently cushion expansion of the layered silicon core.

In an optional embodiment of the second aspect, the electrode material further includes a coating layer, coated on the outer surface of the layered silicon core. The graphene quantum dots are coated by the carbon coating layer.

According to a third aspect, an embodiment of this application provides an electrode material, including a layered silicon core and a carbon coating layer coated on a surface of the layered silicon core. In the foregoing technical solution, when the layered silicon core is used as a negative electrode material of a battery, a large quantity of interlayer gaps of the layered silicon core can be used to alleviate expansion pressure of a negative electrode in a lithium (or another ion released by a positive electrode of the battery) intercalated state, thereby reducing a volume change of the negative electrode material of the battery in charging and discharging processes, effectively avoiding pulverization of the negative electrode material of the battery, and improving a service life of the negative electrode material of the battery. Further, the carbon coating layer is further prepared on an outer surface of the layered silicon core. The carbon coating layer can solidify the layered silicon core, and be used to avoid direct contact between the layered silicon core and an electrolyte, thereby reducing a side reaction, preventing silicon pulverization in a long-term cycle process, and further improving cycle performance. In addition, the carbon coating layer may further provide a stable graphitized interface, and provide more lithium ion deintercalation channels, to reduce electrochemical reaction impedance of the interface, reduce a quantity of negative electrode film forming additives, and improve power performance.

According to a fourth aspect, an embodiment of this application provides a method for preparing an electrode material, including the following steps: First, a metal silicide reacts with a metal removal agent, to generate a layered silicon core from which metal is removed. A metal element in the metal silicide may be an alkali metal or an alkaline earth metal, and the metal removal agent may be ethanol, propanol, butanol, isopropanol, an oxidizing reagent, an acid solution, or the like. The layered silicon core generated in the reaction between the metal silicide and the metal removal agent includes at least two layers of silicon-based materials, an interlayer gap exists between two neighboring layers of the at least two layers of silicon-based materials, and the silicon-based material includes at least one of silicon or an oxide of silicon. For example, the silicon-based material may be any one of silicon, silicon dioxide, or silicon monoxide; or the silicon-based material includes two of silicon, silicon dioxide, and silicon monoxide, or includes all of silicon, silicon dioxide, and silicon monoxide. Then, graphene quantum dots are assembled in the interlayer gap of the layered silicon core. A manner of assembling the graphene quantum dots may be growing graphene quantum dots in situ in the interlayer gap of the layered silicon core, or may be migrating prepared graphene quantum dots to the interlayer gap of the layered silicon core.

In the foregoing technical solution, the layered silicon core is prepared and formed, and expansion pressure of a negative electrode material is effectively suppressed during lithium intercalation by using the interlayer gap of the layered silicon core, thereby reducing a volume change of the negative electrode material of a battery in charging and discharging processes, and improving a service life of the negative electrode material of the battery. In addition, the graphene quantum dots are further filled in the interlayer gap of the layered silicon core. The graphene quantum dots are used to support layers of the silicon-based materials to improve strength of the layered silicon core and prevent structural collapse of the layered silicon core after repeated expansion and contraction. Moreover, the graphene quantum dots have superior conductivity, which also helps transmission of electrons and can improve conductivity of the electrode material.

In an optional embodiment of the fourth aspect, in addition to being assembled in the interlayer gap of the layered silicon core, the graphene quantum dots may also be assembled on an outer surface of the layered silicon core. The graphene quantum dots formed on the outer surface of the layered silicon core can further improve conductivity of the layered silicon core, and malleability of the graphene quantum dots can also excellently cushion expansion of the layered silicon core.

In an optional embodiment of the fourth aspect, after the graphene quantum dots are assembled in the interlayer gap of the layered silicon core, a coating layer is further prepared on an outer surface of the layered silicon core in which the graphene quantum dots are assembled. The coating layer may be an amorphous carbon coating layer; or may be an inorganic compound coating layer, such as a lithium titanate coating layer; or may be an organic coating layer, such as a polyaniline coating layer. A process of preparing the coating layer may be vaporization, sputtering, electroplating, chemical vapor deposition (CVD), or the like. The coating layer prepared on the outer surface of the layered silicon core can solidify the layered silicon core, and be used to avoid direct contact between the layered silicon core and an electrolyte, thereby reducing a side reaction, preventing silicon pulverization in a long-term cycle process, and further improving cycle performance. In addition, when the coating layer is a carbon coating layer, a stable graphitized interface may further be provided, and more lithium ion deintercalation channels may be provided, to reduce electrochemical reaction impedance of the interface, reduce a quantity of negative electrode film forming additives, and improve power performance.

In an optional embodiment of the fourth aspect, in addition to being assembled in the interlayer gap of the layered silicon core, the graphene quantum dots may also be assembled on an outer surface of the layered silicon core. In addition, after the graphene quantum dots are assembled, a coating layer is further prepared on the outer surface, of the layered silicon core, on which the graphene quantum dots are assembled. Malleability of the graphene quantum dots on the surface of the layered silicon core can excellently cushion expansion of the layered silicon core. The coating layer can solidify the layered silicon core, and be used to avoid direct contact between the layered silicon core material and an electrolyte, thereby reducing a side reaction, preventing silicon pulverization in a long-term cycle process, and further improving cycle performance. In addition, when the coating layer is a carbon coating layer, a stable graphitized interface may further be provided, and more lithium ion deintercalation channels may be provided, to reduce electrochemical reaction impedance of the interface, reduce a quantity of negative electrode film forming additives, and improve power performance.

In an optional embodiment of the fourth aspect, a chemical vapor deposition CVD process is used to grow the graphene quantum dots in the interlayer gap of the layered silicon core. A carbon source used in the CVD process may be a carbon-containing gaseous hydrocarbon substance, such as methane, ethane, propane, ethylene, propylene, or acetylene. It is efficient to grow the graphene quantum dots in situ in the interlayer gap of the layered silicon core based on the CVD process. The graphene quantum dots obtained after the preparation support the layered silicon core relatively well, and the graphene quantum dots have superior electrical performance.

In an optional embodiment of the fourth aspect, the graphene quantum dots are migrated to the interlayer gap of the layered silicon core, so as to assemble the graphene quantum dots in the interlayer gap of the layered silicon core. This manner has an advantage of low costs.

In an optional embodiment of the fourth aspect, the metal silicide used for preparing the layered silicon core is prepared based on silicon and at least one type of metal, and the metal silicide may be a compound of a metal element and silicon, or may be a compound of two or more metal elements and silicon. The metal silicide may be prepared by using a process such as sintering, vaporization, sputtering, electroplating, or CVD. This manner can reduce costs of preparing the electrode material.

In an optional embodiment of the fourth aspect, the metal silicide is prepared based on silicon and at least one of an alkaline metal or an alkaline earth metal (such as Li, Na, Ca, or Mg), and a layered silicon core with relatively high purity can be prepared through a metal-removing reaction of the metal silicide.

According to a fifth aspect, an embodiment of this application provides a method for preparing an electrode material. The method includes the following steps: First, a metal silicide reacts with a metal removal agent, to generate a layered silicon core from which metal is removed. The layered silicon core includes at least two layers of silicon-based materials, an interlayer gap exists between two neighboring layers of the at least two layers of silicon-based materials, and the silicon-based material includes at least one of silicon or an oxide of silicon. Then, graphene quantum dots are assembled on an outer surface of the layered silicon core. In this embodiment, when the layered silicon core is used as a negative electrode material of a battery, a large quantity of interlayer gaps of the layered silicon core can be used to alleviate expansion pressure of a negative electrode in a lithium (or another ion released by a positive electrode of the battery) intercalated state, thereby reducing a volume change of the negative electrode material of the battery in charging and discharging processes, effectively avoiding pulverization of the negative electrode material of the battery, and improving a service life of the negative electrode material of the battery. The graphene quantum dots formed on the outer surface of the layered silicon core can improve conductivity of the layered silicon core, and malleability of the graphene quantum dots can also excellently cushion expansion of the layered silicon core.

In an optional embodiment of the fifth aspect, after the graphene quantum dots are assembled on the outer surface of the layered silicon core, a coating layer is further prepared on the outer surface, of the layered silicon core, on which the graphene quantum dots are assembled. The coating layer may be an amorphous carbon coating layer; or may be an inorganic compound coating layer, such as a lithium titanate coating layer; or may be an organic coating layer, such as a polyaniline coating layer. Malleability of the graphene quantum dots on the surface of the layered silicon core can excellently cushion expansion of the layered silicon core. The coating layer can solidify the layered silicon core, and be used to avoid direct contact between the layered silicon core material and an electrolyte, thereby reducing a side reaction, preventing silicon pulverization in a long-term cycle process, and further improving cycle performance. In addition, when the coating layer is a carbon coating layer, a stable graphitized interface may further be provided, and more lithium ion deintercalation channels may be provided, to reduce electrochemical reaction impedance of the interface, reduce a quantity of negative electrode film forming additives, and improve power performance.

According to a sixth aspect, an embodiment of this application provides a method for preparing an electrode material. The method includes the following steps: First, a metal silicide reacts with a metal removal agent, to generate a layered silicon core from which metal is removed. The layered silicon core includes at least two layers of silicon-based materials, an interlayer gap exists between two neighboring layers of the at least two layers of silicon-based materials, and the silicon-based material includes at least one of silicon or an oxide of silicon. Then, a coating layer is prepared on an outer surface of the layered silicon core. The coating layer may be an amorphous carbon coating layer; or may be an inorganic compound coating layer, such as a lithium titanate coating layer; or may be an organic coating layer, such as a polyaniline coating layer. In the foregoing technical solution, when the layered silicon core is used as a negative electrode material of a battery, a large quantity of interlayer gaps of the layered silicon core can be used to alleviate expansion pressure of a negative electrode in a lithium (or another ion released by a positive electrode of the battery) intercalated state, thereby reducing a volume change of the negative electrode material of the battery in charging and discharging processes, effectively avoiding pulverization of the negative electrode material of the battery, and improving a service life of the negative electrode material of the battery. Further, the coating layer is further prepared on the outer surface of the layered silicon core. The coating layer can solidify the layered silicon core, and be used to avoid direct contact between the layered silicon core and an electrolyte, thereby reducing a side reaction, preventing silicon pulverization in a long-term cycle process, and further improving cycle performance. In addition, when the coating layer is a carbon coating layer, a stable graphitized interface may further be provided, and more lithium ion deintercalation channels may be provided, to reduce electrochemical reaction impedance of the interface, reduce a quantity of negative electrode film forming additives, and improve power performance.

According to a seventh aspect, an embodiment of this application provides an electrode material, and the electrode material is prepared by using the method according to the fourth aspect or any optional embodiment of the fourth aspect.

According to an eighth aspect, an embodiment of this application provides an electrode material, and the electrode material is prepared by using the method according to the fifth aspect or any optional embodiment of the fifth aspect.

According to a ninth aspect, an embodiment of this application provides an electrode material, and the electrode material is prepared by using the method according to the sixth aspect.

In all the foregoing possible embodiments, two neighboring layers of the at least two layers of silicon-based materials of the layered silicon core are at least partially connected, so that the layered silicon core has a stable layered structure.

In all the foregoing possible embodiments, a size of the graphene quantum dot in a plane direction ranges from 1 nm to 60 nm. For example, a planar size of the graphene quantum dot is 1 nm, 2 nm, 5 nm, 10 nm, 20 nm, 30 nm, 40 nm, 50 nm, or 60 nm. The graphene quantum dots in the foregoing planar size not only support the layered silicon core relatively well, but also have excellent electrical performance.

In all the foregoing possible embodiments, a quantity of layers of the graphene quantum dot ranges from 1 to 3, such as a single-layer graphene quantum dot, a double-layer graphene quantum dot, and a three-layer graphene quantum dot. The graphene quantum dots each having the foregoing quantity of layers not only support the layered silicon core relatively well, but also have excellent electrical performance.

According to a tenth aspect, an embodiment of this application provides a battery, including a positive electrode, an electrolyte, and a negative electrode. The negative electrode is prepared by using the electrode material according to the first aspect, any optional embodiment of the first aspect, the second aspect, any optional embodiment of the second aspect, or any embodiment of the third aspect, the seventh aspect, the eighth aspect, or the ninth aspect.

DESCRIPTION OF EMBODIMENTS

To make the objectives, technical solutions, and advantages of this application clearer, the following further describes this application in detail with reference to the accompanying drawings.

"A plurality of" mentioned in this application means "two or more". In addition, it should be understood that the term "and/or" in this application describes only an association relationship for describing associated objects and represents that three relationships may exist. For example, A and/or B may represent the following three cases: Only A exists, both A and B exist, and only B exists.

A quantum dot is a quasi-zero-dimensional nanomaterial including a small quantity of atoms. Sizes of the quantum dot in three dimensions are usually below 100 nanometers (nm), and motion of electrons inside the quantum dot is limited in each direction. Therefore, a quantum confinement effect is especially distinct.

Chemical vapor deposition (CVD) refers to a process in which a gaseous reactant or vapor of a liquid reactant that includes an element of a target substance, and another gas required in a reaction are introduced into a reaction chamber, and a chemical reaction occurs on a substrate surface to generate a thin film, a particle, or a quantum dot.

Embodiment 1

Figure 1:
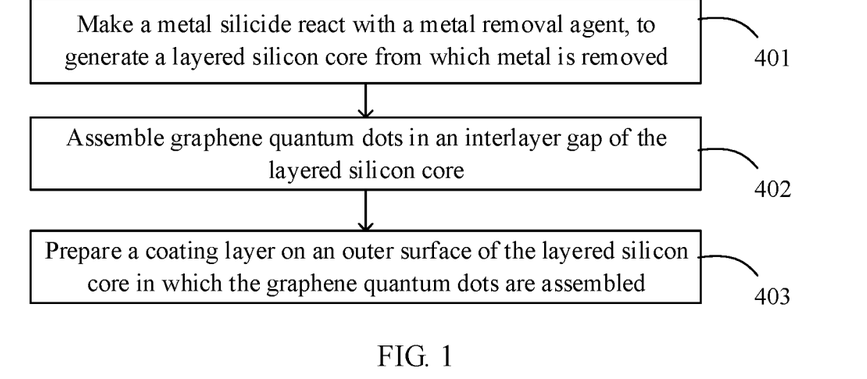
FIG. 1 is a schematic flowchart of a method for preparing an electrode material according to an embodiment of this application.

FIG. 1 is a schematic flowchart of a method for preparing an electrode material according to this application. The method includes the following steps.

Step 401: Make a metal silicide react with a metal removal agent, to generate a layered silicon core from which metal is removed. The layered silicon core includes at least two layers of silicon-based materials, an interlayer gap exists between two neighboring layers of the at least two layers of silicon-based materials, and the silicon-based material includes at least one of silicon or an oxide of silicon. For example, the silicon-based material may be any one of silicon, silicon dioxide, or silicon monoxide; or the silicon-based material includes two of silicon, silicon dioxide, and silicon monoxide, or includes all of silicon, silicon dioxide, and silicon monoxide.

Figure 2A:
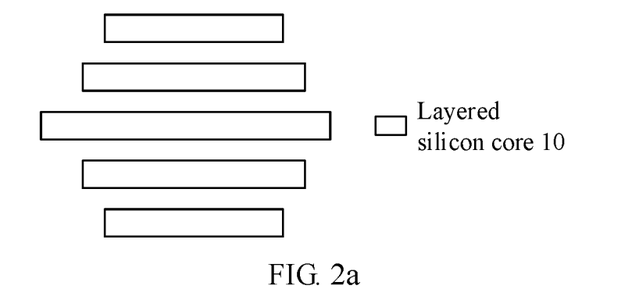
FIG. 2a to FIG. 2h are schematic diagrams of processes of preparing an electrode material according to embodiments of this application.

FIG. 2a is a schematic diagram of the layered silicon core. It should be noted that, in the technical solution of this embodiment of this application, although the interlayer gap exists between the two neighboring layers of the silicon-based materials of the layered silicon core, the two neighboring layers may alternatively be partially connected. To better reflect the interlayer gap of the layered silicon core, in FIG. 2a and the following schematic diagrams, it is simplified that two neighboring layers of the silicon-based materials of the layered silicon core are separated from each other.

The metal silicide may be a finished product, or may be generated based on a reaction between metal and silicon. A method for preparing the metal silicide includes, but is not limited to, sintering, vaporization, sputtering, electroplating, CVD, or the like. A metal element in the metal silicide may be an alkaline metal or an alkaline earth metal, such as Li, Na, Ca, or Mg. The metal silicide may be a compound of a metal element and silicon, or may be a compound of two or more metal elements and silicon, such as $Li_3NaSi_6$ formed by lithium, sodium, and silicon.

The metal removal agent is used for a metal removal reaction with the metal silicide, and the metal removal agent may vary according to a type of metal silicide. For example, when the metal silicide is a silicide of lithium ($Li_tSi_x$), the metal removal agent is a chemical de-lithium reagent that includes but is not limited to ethanol, propanol, butanol, isopropanol, or the like. When the metal silicide is calcium silicide ($CaSi_2$), the metal removal agent may be an oxidizing reagent or an acid solution that includes but is not limited to $CuCl_2$, $SnCl_2$, HCl, or the like.

In some embodiments, the silicon or the oxide of silicon that is generated after the metal is removed from the metal silicide has an amorphous structure.

In some embodiments, the metal silicide reacts with the metal removal agent in different reaction media, and silicon-based materials in different oxidation states may be obtained. For example, when the reaction medium is water, the calcium silicide reacts with the metal removal agent to obtain silicon dioxide $SiO_2$; when the reaction medium belongs to alcohol, the calcium silicide reacts with the metal removal agent, and oxides of silicon other than silicon dioxide may be obtained and are represented as $S_iO_x$; or when the reaction medium is molten salt, the calcium silicate reacts with the metal removal agent to obtain pure Si.

The silicon-based materials are formed by removing the metal from the metal silicide, and a large quantity of gaps formed after the metal is removed exist in all the silicon-based materials, so that the silicon-based materials are in a layered form. When the layered silicon core is used as a negative electrode material of a battery, a large quantity of interlayer gaps of the layered silicon core can be used to alleviate expansion pressure of a negative electrode in a lithium (or another ion released by a positive electrode of the battery) intercalated state, thereby reducing a volume change of the negative electrode material of the battery in charging and discharging processes, effectively avoiding pulverization of the negative electrode material of the battery, and improving a service life of the negative electrode material of the battery.

Figure 2B:
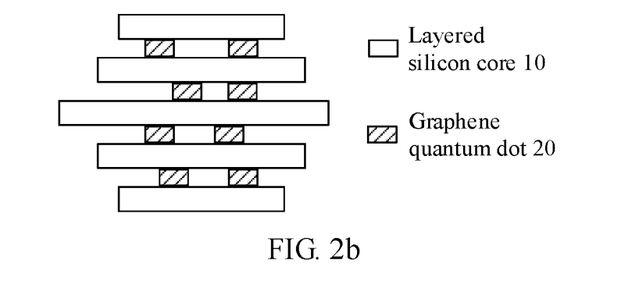

Step 402: Assemble graphene quantum dots in the interlayer gap of the layered silicon core. FIG. 2b is a schematic diagram of a layered silicon core in which the graphene quantum dots are assembled.

In this embodiment of this application, the graphene quantum dots may be assembled in the interlayer gap of the layered silicon core in a plurality of manners that include but are not limited to the following manners:

Manner 1: Graphene quantum dots are grown in situ in the interlayer gap of the layered silicon core.

If a CVD process is used to grow the graphene quantum dots, a specific process may be as follows: heating the layered silicon core; after temperature rises to a specified temperature, continuously introducing hydrogen $H_2$ and a gaseous carbon source for a period of time; then, stopping introducing the gaseous carbon source, and introducing argon Ar gas for cooling, so that the layered silicon core in which the graphene quantum dots are disposed can be obtained, where the graphene quantum dots are located in the interlayer gap of the layered silicon core. The gaseous carbon source may be a carbon-containing gaseous hydrocarbon substance that includes but is not limited to methane, ethane, propane, ethylene, propylene, acetylene, or the like.

Manner 2: Prepared graphene quantum dots are migrated to the interlayer gap of the layered silicon core.

For example, graphene quantum dots that grow on another substrate are immersed in a solution, such as alcohol or isopropanolamine (IPA); then, the substrate on which the graphene quantum dots grow is corroded; and the graphene quantum dots are migrated to the interlayer gap of the layered silicon core in a liquid phase.

In the foregoing technical solution, the layered silicon core is prepared and formed, and expansion pressure of the negative electrode material is effectively suppressed during lithium intercalation by using the interlayer gap of the layered silicon core, thereby reducing a volume change of the negative electrode material of the battery in charging and discharging processes, and improving a service life of the negative electrode material of the battery. In addition, the graphene quantum dots are filled in the interlayer gap of the layered silicon core. The graphene quantum dots are used to support layers of the silicon-based materials to improve strength of the layered silicon core and prevent structural collapse of the layered silicon core after repeated expansion and contraction. Moreover, the graphene quantum dots have superior conductivity, which also helps transmission of electrons and can improve conductivity of the electrode material.

Figure 2C:
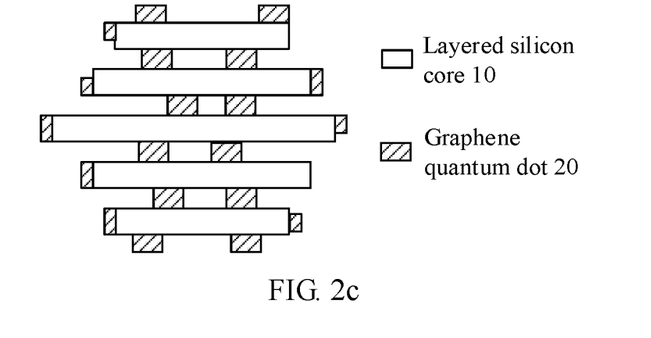

In an optional manner, referring to FIG. 2c, in addition to being assembled in the interlayer gap of the layered silicon core, the graphene quantum dots may also be assembled on an outer surface of the layered silicon core.

For example, when the CVD process is used to grow graphene quantum dots, the graphene quantum dots may grow in the interlayer gap of the layered silicon core and on the outer surface of the layered silicon core. For another example, when the graphene quantum dots are migrated to the interlayer gap of the layered silicon core in a migration manner, some graphene quantum dots may also be migrated to the outer surface of the layered silicon core.

In the foregoing technical solution, the graphene quantum dots formed on the outer surface of the layered silicon core can further improve conductivity of the layered silicon core, and malleability of the graphene quantum dots can also excellently cushion expansion of the layered silicon core.

In another optional manner, after step 402, the following step is further included.

Step 403: Prepare a coating layer on the outer surface of the layered silicon core in which the graphene quantum dots are assembled. The coating layer may be an amorphous carbon coating layer; or may be an inorganic compound coating layer, such as a lithium titanate coating layer; or may be an organic coating layer, such as a polyaniline coating layer.

Figure 2D:
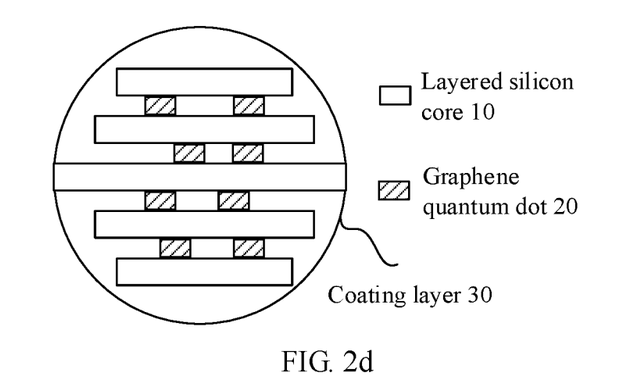
Figure 2E:
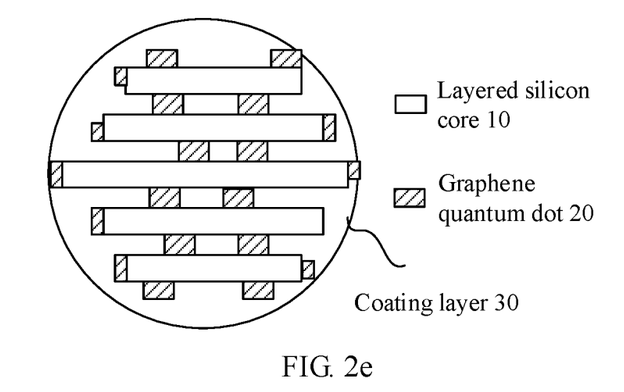

With reference to the structure shown in FIG. 2b, a material structure obtained after the coating layer is prepared is shown in FIG. 2d. With reference to a structure shown in FIG. 2c, a material structure obtained after the coating layer is prepared is shown in FIG. 2e. It should be noted that a cross sectional shape of the coating layer in FIG. 2d to FIG. 2e is simplified into a circle. During specific embodiment, the cross sectional shape of the coating layer may be another shape such as an ellipse, or may be an irregular shape.

An example in which the layered silicon core is coated by a carbon coating layer is used. In this embodiment of this application, the carbon coating layer may be prepared in a plurality of manners that include but are not limited to vaporization, sputtering, electroplating, CVD, and the like. For example, a layered silicon-graphene quantum dot composite material formed in step 402 is mixed with a carbon source to crack at a high temperature, and the carbon coating layer is formed on an outer surface of the layered silicon-based-graphene quantum dot composite material. The carbon source is a gaseous carbon source, a liquid carbon source, or a solid carbon source. The gaseous carbon source includes, but is not limited to, methane, ethane, ethylene, acetylene, propylene, carbon monoxide, or the like. The liquid carbon source includes, but is not limited to, methanol, ethanol, hexane, cyclohexane, benzene, toluene, xylene, or the like. The solid carbon source includes, but is not limited to, polyethylene, polypropylene, polyvinyl chloride, polyvinylidene fluoride, polyacrylonitrile, polystyrene, epoxy resin, phenol formaldehyde resin, glucose, fructose, sucrose, maltose, coal tar pitch, petroleum asphalt, or the like.

In the foregoing technical solution, the coating layer is prepared on the outer surface of the layered silicon core. The coating layer can solidify the layered silicon core, and be used to avoid direct contact between the layered silicon core and an electrolyte, thereby reducing a side reaction, preventing silicon pulverization in a long-term cycle process, and further improving cycle performance. In addition, when the layered silicon core is coated by the carbon coating layer, a stable graphitized interface may further be provided, and more lithium ion deintercalation channels may be provided, to reduce electrochemical reaction impedance of the interface, reduce a quantity of negative electrode film forming additives, and improve power performance.

The following describes application instances of preparing the electrode material according to the foregoing technical solutions.

Application Instance 1

Step 1: Prepare a Metal Silicide $Li_{12}Si_7$.

A Si block and a Li band in a stoichiometric ratio (considering a loss of Li during evaporation, an amount of Li may be overdosed by 7%) react with each other in an Ar gas environment through arc melting, to generate a $Li_{12}Si_7$ compound. When the $Li_{12}Si_7$ compound was cooled down, an obtained block was ground into powder in an Ar gas-filled glove box by using a mortar.

Step 2: Prepare an Amorphous Layered Silicon Core.

1.0 g powder obtained after the grinding in step 1 is placed in a flask, and the flask is placed in the Ar gas-filled glove box. 120 mL ethanol is added to the flask and is continuously stirred. Lithium silicon reacts with ethanol. A reaction product is transferred to a Buchner funnel for filtering by using filter paper. Filter residue is washed three times separately by using distilled water and 1 mole/liter ($mol*L^{-1}$) hydrochloric acid, and then is washed to neutral by using distilled water, to obtain a black product that is insoluble in water. The product is heated at 120° C. for 3 h under protection of Ar gas in a tube furnace. In this way, the amorphous layered silicon core can be obtained.

Step 3: Dispose Graphene Quantum Dots in the Amorphous Layered Silicon Core.

The amorphous layered silicon core prepared in step 2 is placed in a clean quartz boat, and the quartz boat is placed in a heating area of a track furnace. $H_2$ is introduced at a rate of 20 mL/min. A heating program is started, and a temperature is increased to 900° C. slowly at a heating rate of 10° C./min. After $H_2$ is introduced at the rate of 20 mL/min and $CH_4$ is introduced at a rate of 5 mL/min continuously for 15 min, a furnace box slides out of a sample area, introduction of the carbon source is stopped, and finally Ar gas is introduced at a rate of 150 mL/min for cooling, to obtain the amorphous layered silicon core in which the graphene quantum dots are disposed.

Step 4: Prepare a Carbon Coating Layer.

0.2 g amorphous layered silicon-graphene quantum dot composite material obtained in step 3 and 0.4 g polyacrylonitrile are dispersed in 10 mL dimethylformamide evenly through ultrasonic processing and stirring. Then, dimethylformamide is steamed; and an obtained solid is transferred to a high temperature furnace, heated to 900° C. under protection of $N_2$, and heated at 900° C. for 2 h. After the furnace is naturally cooled down, a product is taken out. A carbon coating layer is formed on a surface of the amorphous layered silicon-graphene quantum dot composite material after cracking of polyacrylonitrile, to obtain a final amorphous layered silicon-graphene quantum dot-carbon composite material.

Application Instance 2

Step 5: Prepare a Metal Silicide $CaSi_2$.

Debris of pure calcium and powder of pure silicon are mixed evenly and placed in a hard unglazed porcelain boat. The porcelain boat is put into a quartz reaction tube, and $CO_2$ is introduced into the tube. A temperature in the quartz reaction tube is 1000° C. A mixture of the debris of pure calcium and the powder of pure silicon is melted, and a reaction takes place subsequently. Then, the porcelain boat is taken out, and a product CaSi is solidified immediately. A porous leaden lump CaSi having a metal luster is obtained and is then shattered. CaSi and Si powder in a stoichiometric ratio are evenly mixed, and an obtained mixture is placed in a nickel boat. The mixture is heated at 1000° C. in an $H_2$ flow, and CaSi reacts with Si. Because the reaction between CaSi and Si is slow, the nickel boat may be heated for 15 h, to obtain $CaSi_2$.

Step 6: Prepare an amorphous layered silicon core. The processes of preparing the amorphous layered silicon core in different reaction media are described below.

Case 1: The Reaction Medium is an Aqueous Solution.

0.2 g $CaSi_2$ is mixed with 20 mL of a 0.2 $mol*L^{-1}$ $CuCl_2$ aqueous solution, and the solution is stirred at room temperature for 2 h. An obtained product is obtained after filtering, and is washed by using water and ethanol. Then, vacuum drying is performed on the product at 80° C. for 24 h. Generated Cu nanoparticles are removed by using the $CuCl_2$ aqueous solution, to obtain amorphous $SiO_2$ with a layered structure.

The foregoing process can be represented by the following chemical equations:

$$CaSi_2 + CuCl_2 \rightarrow CaCl_2 + 2Si + Cu; \text{ and}$$

$$2Si + 4H_2O \rightarrow 2SiO_2 + 4H_2.$$

Case 2: The Reaction Medium is an Ethanol Solution.

0.2 g $CaSi_2$ is mixed with 40 mL of a 0.1 $mol*L^{-1}$ $SnCl_2$ ethanol solution, and the solution is stirred at 60° C. for 10 h. An obtained product is obtained after filtering, and is washed by using ethanol. Then, vacuum drying is performed on the product at 80° C. for 24 h. Generated Sn nanoparticles are removed by using an HCl ethanol solution, to obtain amorphous $SiO_x$ with a layered structure.

The foregoing process can be represented by the following chemical equations:

$$CaSi_2 + SnCl_2 \rightarrow 2Si + CaCl_2 + Sn;$$

$$Si + CH_3CH_2OH \rightarrow SiO_x + \text{reduzate},$$

where reduzate in the equation indicates anoxic sediment;

$$CaSi_2 + SnCl_2 \rightarrow 2Si + CaCl_2 + Sn; \text{ and}$$

$$Si + CH_3CH_2OH \rightarrow SiO_x + \text{reduzate}.$$

Case 3: The Reaction Medium is Molten Salt.

1 g $CaSi_2/SnCl_2$ (mole ratio 1:1.5) is mixed with 10 g LiCl/KCl (mole ratio 59:41). An obtained mixture is ground evenly in an Ar gas-filled glove box, and obtained powder is placed in a ceramic crucible and sintered at 400° C. for 5 h under protection of Ar gas. An obtained product is washed by using ethanol, and then vacuum drying is performed on the product at 80° C. for 24 h. Generated Sn nanoparticles are removed by using an HCl ethanol solution to obtain amorphous Si with a layered structure.

The foregoing process can be represented by the following chemical equation:

$$CaSi_2 + SnCl_2 \rightarrow 2Si + CaCl_2 + Sn.$$

Step 7: Dispose Graphene Quantum Dots in the Layered Silicon Core.

The amorphous layered silicon core prepared in step 6 is placed in a clean quartz boat, and the quartz boat is placed in a heating area of a track furnace. $H_2$ is introduced at a rate of 20 mL/min. A heating program is started, and a temperature is increased to 900° C. slowly at a heating rate of 10° C./min. After $H_2$ is introduced at the rate of 20 mL/min and $CH_4$ is introduced at a rate of 5 mL/min continuously for 15 min, a furnace box slides out of a sample area, introduction of the carbon source is stopped, and finally Ar gas is introduced at a rate of 150 mL/min for cooling, to obtain the amorphous layered silicon core in which the graphene quantum dots are disposed.

Step 8: Prepare a Carbon Coating Layer.

0.2 g amorphous layered silicon-graphene quantum dot composite material prepared in step 7 and 0.4 g polyacrylonitrile are dispersed in 10 mL dimethylformamide evenly through ultrasonic processing and stirring. Then, dimethylformamide is steamed; and a solid is transferred to a high temperature furnace, heated to 900° C. under protection of $N_2$, and heated at 900° C. for 2 h. After the furnace is naturally cooled down, a product is taken out. A carbon coating layer is formed on a surface of the amorphous layered silicon-graphene quantum dot composite material after cracking of polyacrylonitrile, to obtain a final amorphous layered silicon-graphene quantum dot-carbon composite material.

It should be noted that the foregoing two application instances are only examples, and cannot be used to limit the technical solutions of this embodiment of this application.

Embodiment 2

Figure 2F:
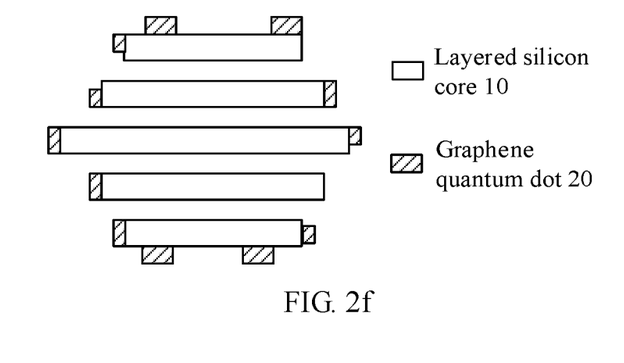

In a method for preparing an electrode material provided in Embodiment 2 of this application, after the layered silicon core is obtained according to step 401, graphene quantum dots are disposed on an outer surface of the layered silicon core. FIG. 2f is a schematic diagram of a layered silicon core with a surface on which graphene quantum dots are disposed. A manner of forming the graphene quantum dots on the surface of the layered silicon core may be growing graphene quantum dots in situ on the surface of the layered silicon core, such as using a CVD process to grow the graphene quantum dots. In addition, prepared graphene quantum dots may alternatively be migrated to the outer surface of the layered silicon core.

When the layered silicon core is used as a negative electrode material of a battery, a large quantity of interlayer gaps of the layered silicon core can be used to alleviate expansion pressure of the negative electrode in a lithium (or another ion released by a positive electrode of the battery) intercalated state, thereby reducing a volume change of the negative electrode material of the battery in charging and discharging processes, effectively avoiding pulverization of the negative electrode material of the battery, and improving a service life of the negative electrode material of the battery. The graphene quantum dots formed on the outer surface of the layered silicon core can improve conductivity of the layered silicon core, and malleability of the graphene quantum dots can also excellently cushion expansion of the layered silicon core.

Figure 2G:
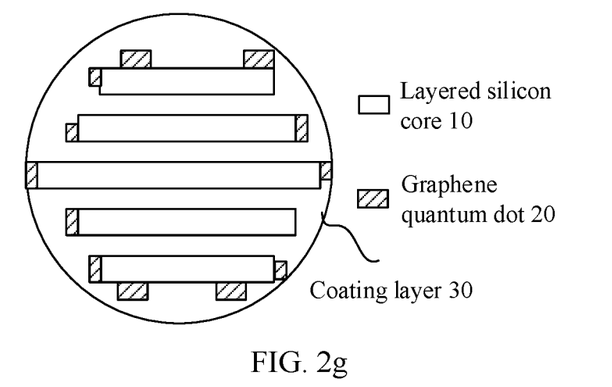

In an optional manner, after the graphene quantum dots are disposed on the outer surface of the layered silicon core, a coating layer is prepared on the outer surface of the layered silicon core, and a formed structure is shown in FIG. 2g. An embodiment of preparing the coating layer is already described in Embodiment 1, and details are not repeated herein. The coating layer on the outer surface of the layered silicon core can solidify the layered silicon core, and be used to avoid direct contact between the layered silicon core and an electrolyte, thereby reducing a side reaction, preventing silicon pulverization in a long-term cycle process, and further improving cycle performance. In addition, when the layered silicon core is coated by a carbon coating layer, a stable graphitized interface may further be provided, and more lithium ion deintercalation channels may be provided, to reduce electrochemical reaction impedance of the interface, reduce a quantity of negative electrode film forming additives, and improve power performance.

Embodiment 3

Figure 2H:
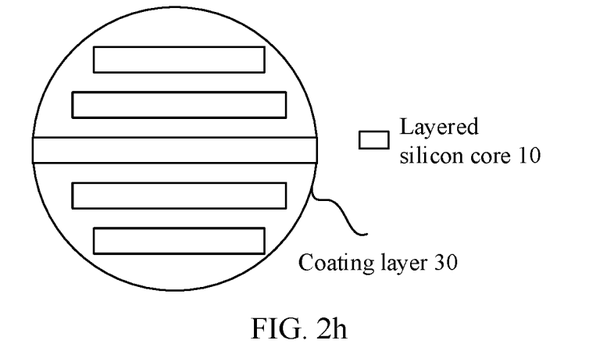

Referring to FIG. 2h, in a method for preparing an electrode material provided in Embodiment 3 of this application, after obtaining the layered silicon core according to step 401, a coating layer is prepared on an outer surface of the layered silicon core. A forming embodiment is already described in detail in step 403, and details are not repeated herein.

In the foregoing technical solution, when the layered silicon core is used as a negative electrode material of a battery, a large quantity of interlayer gaps of the layered silicon core can be used to alleviate expansion pressure of the negative electrode in a lithium (or another ion released by a positive electrode of the battery) intercalated state, thereby reducing a volume change of the negative electrode material of the battery in charging and discharging processes, effectively avoiding pulverization of the negative electrode material of the battery, and improving a service life of the negative electrode material of the battery. Further, the coating layer is further prepared on the outer surface of the layered silicon core. The coating layer can solidify the layered silicon core, and be used to avoid direct contact between the layered silicon core and an electrolyte, thereby reducing a side reaction, preventing silicon pulverization in a long-term cycle process, and further improving cycle performance. In addition, when the layered silicon core is coated by a carbon coating layer, a stable graphitized interface may further be provided, and more lithium ion deintercalation channels may be provided, to reduce electrochemical reaction impedance of the interface, reduce a quantity of negative electrode film forming additives, and improve power performance.

Embodiment 4

Embodiment 4 of this application provides an electrode material. The electrode material is prepared according to the method provided in any one of Embodiment 1, Embodiment 2, and Embodiment 3. In this way, when the electrode material is used as a negative electrode of a battery, expansion pressure of a negative electrode material during lithium intercalation can be effectively suppressed by using an interlayer gap of a layered silicon core, thereby reducing a volume change of the negative electrode material of the battery in charging and discharging processes, and improving a service life of the negative electrode material of the battery.

In addition, in the electrode material prepared according to the method of Embodiment 1, graphene quantum dots are filled in the interlayer gap of the layered silicon core. The graphene quantum dots are used to support layers of the silicon-based materials to improve strength of the layered silicon core and prevent structural collapse of the layered silicon core after repeated expansion and contraction. Moreover, the graphene quantum dots have superior conductivity, which also helps transmission of electrons and can improve conductivity of the electrode material.

In the electrode material prepared according to the method of Embodiment 2, the graphene quantum dots formed on an outer surface of the layered silicon core can improve conductivity of the layered silicon core, and malleability of the graphene quantum dots can also excellently cushion expansion of the layered silicon core.

In the electrode material prepared according to the method of Embodiment 3, a coating layer is prepared on the outer surface of the layered silicon core. The coating layer can solidify the layered silicon core, and be used to avoid direct contact between the layered silicon core and an electrolyte, thereby reducing a side reaction, preventing silicon pulverization in a long-term cycle process, and further improving cycle performance. In addition, when the layered silicon core is coated by a carbon coating layer, a stable graphitized interface may further be provided, and more lithium ion deintercalation channels may be provided, to reduce electrochemical reaction impedance of the interface, reduce a quantity of negative electrode film forming additives, and improve power performance.

Embodiment 5

FIG. 2b shows an electrode material according to Embodiment 5 of this application. The electrode material includes a layered silicon core 10 and graphene quantum dots 20. Referring to FIG. 2a, the layered silicon core 10 includes at least two layers of silicon-based materials, an interlayer gap exists between two neighboring layers of the at least two layers of silicon-based materials, and the silicon-based material includes at least one of silicon or an oxide of silicon. It should be noted that, in the technical solution of this embodiment of this application, although the interlayer gap exists between the two neighboring layers of the silicon-based materials of the layered silicon core, the two neighboring layers of the silicon-based materials may alternatively be partially connected, so as to provide a stable layered structure. The graphene quantum dots 20 are located in the interlayer gap of the layered silicon core 10.

In the foregoing technical solution, when the electrode material is used as a negative electrode of a battery, expansion pressure of a negative electrode material during lithium intercalation can be effectively suppressed by using the interlayer gap of the layered silicon core, thereby reducing a volume change of the negative electrode material of the battery in charging and discharging processes, and improving a service life of the negative electrode material of the battery. In addition, the graphene quantum dots are filled in the interlayer gap of the layered silicon core. The graphene quantum dots are used to support layers of the silicon core to improve strength of the layered silicon core and prevent structural collapse of the layered silicon core after repeated expansion and contraction. Moreover, the graphene quantum dots have superior conductivity, which also helps transmission of electrons and can improve conductivity of the electrode material.

In an optional manner, referring to FIG. 2c, the graphene quantum dots 20 are further located on an outer surface of the layered silicon core 10, so as to further improve conductivity of the layered silicon core 10. Malleability of the graphene quantum dots 20 on a surface of the layered silicon core 10 can also excellently cushion expansion of the layered silicon core 10.

In an optional manner, referring to FIG. 2d, the electrode material further includes a coating layer 30. The coating layer 30 is coated on the outer surface of the layered silicon core 10. The coating layer 30 may be a carbon coating layer, an organic compound coating layer, an inorganic compound coating layer, or the like. An embodiment of the coating layer 30 is already described in Embodiment 1. The coating layer 30 can solidify the layered silicon core 10, and be used to avoid direct contact between the layered silicon core 10 and an electrolyte, thereby reducing a side reaction, preventing silicon pulverization in a long-term cycle process, and further improving cycle performance. In addition, when the coating layer is a carbon coating layer, a stable graphitized interface may further be provided, and more lithium ion deintercalation channels may be provided, to reduce electrochemical reaction impedance of the interface, reduce a quantity of negative electrode film forming additives, and improve power performance.

In an optional manner, referring to FIG. 2e, the graphene quantum dots 20 are further located on the outer surface of the layered silicon core 10, and the electrode material further includes a coating layer 30. The coating layer 30 is coated on the outer surface of the layered silicon core 10. Malleability of the graphene quantum dots 20 on the surface of the layered silicon core 10 can also excellently cushion expansion of the layered silicon core 10. The coating layer 30 can solidify the layered silicon core 10, and be used to avoid direct contact between the layered silicon core 10 material and an electrolyte, thereby reducing a side reaction, preventing silicon pulverization in a long-term cycle process, and further improving cycle performance. In addition, when the coating layer 30 is a carbon coating layer, a stable graphitized interface may further be provided, and more lithium ion deintercalation channels may be provided, to reduce electrochemical reaction impedance of the interface, reduce a quantity of negative electrode film forming additives, and improve power performance.

Embodiment 6

Referring to FIG. 2f, Embodiment 6 of this application provides an electrode material. The electrode material includes a layered silicon core 10 and graphene quantum dots 20. A structure of the layered silicon core 10 is already described in Embodiment 5. The graphene quantum dots 20 are located on an outer surface of the layered silicon core 10.

When the electrode material is used as a negative electrode of a battery, a large quantity of interlayer gaps of the layered silicon core can be used to alleviate expansion pressure of the negative electrode in a lithium (or another ion released by a positive electrode of the battery) intercalated state, thereby reducing a volume change of the negative electrode of the battery in charging and discharging processes, effectively avoiding pulverization of the negative electrode of the battery, and improving a service life of the negative electrode of the battery. The graphene quantum dots 20 on the outer surface of the layered silicon core 10 can improve conductivity of the layered silicon core 10. Malleability of the graphene quantum dots 20 can also excellently cushion expansion of the layered silicon core 10.

In an optional manner, referring to FIG. 2g, the electrode material further includes a coating layer 30, coated on the outer surface of the layer silicon core 10. The graphene quantum dots 20 are also coated by the coating layer 30. The coating layer 30 may be a carbon coating layer, an organic compound coating layer, an inorganic compound coating layer, or the like. An embodiment of the coating layer 30 is already described in Embodiment 1. The coating layer 30 on the outer surface of the layered silicon core 10 can solidify the layered silicon core 10, and be used to avoid direct contact between the layered silicon core 10 and an electrolyte, thereby reducing a side reaction, preventing silicon pulverization in a long-term cycle process, and further improving cycle performance. In addition, when the coating layer 30 is a carbon coating layer, a stable graphitized interface may further be provided, and more lithium ion deintercalation channels may be provided, to reduce electrochemical reaction impedance of the interface, reduce a quantity of negative electrode film forming additives, and improve power performance.

Embodiment 7

Referring to FIG. 2h, Embodiment 7 of this application provides an electrode material. The electrode material includes a layered silicon core 10 and a coating layer 30. A structure of the layered silicon core 10 is already described in Embodiment 5. An outer surface of the layered silicon core 10 is coated by the coating layer 30. In the foregoing technical solution, when the layered silicon core 10 is used as a negative electrode material of a battery, a large quantity of interlayer gaps of the layered silicon core 10 can be used to alleviate expansion pressure of a negative electrode in a lithium (or another ion released by a positive electrode of the battery) intercalated state, thereby reducing a volume change of the negative electrode material of the battery in charging and discharging processes, effectively avoiding pulverization of the negative electrode material of the battery, and improving a service life of the negative electrode material of the battery. Further, the coating layer 30 is further prepared on the outer surface of the layered silicon core 10. The coating layer 30 can solidify the layered silicon core 10, and be used to avoid direct contact between the layered silicon core 10 and an electrolyte, thereby reducing a side reaction, preventing silicon pulverization in a long-term cycle process, and further improving cycle performance. In addition, when the coating layer 30 is a carbon coating layer, a stable graphitized interface may further be provided, and more lithium ion deintercalation channels may be provided, to reduce electrochemical reaction impedance of the interface, reduce a quantity of negative electrode film forming additives, and improve power performance.

Optionally, in all the foregoing possible embodiments, a size of the graphene quantum dot assembled in the interlayer gap or on a surface of the layered silicon core in a plane direction may range from 1 nm to 60 nm. For example, a planar size of the graphene quantum dot is 1 nm, 2 nm, 5 nm, 10 nm, 20 nm, 30 nm, 40 nm, 50 nm, or 60 nm. The graphene quantum dots in the foregoing planar size not only support the layered silicon core, but also have excellent conductivity. In addition, because the size of the graphene quantum dot is relatively small, a lot of interlayer space remains between layers of the layered silicon core. Therefore, expansion pressure of the negative electrode material during lithium intercalation can be effectively suppressed, and the volume change of the negative electrode material of the battery is reduced in the charging and discharging processes.

Optionally, in all the foregoing possible embodiments, a quantity of layers of the graphene quantum dot may range from 1 to 3, such as a single-layer graphene quantum dot, a double-layer graphene quantum dot, and a three-layer graphene quantum dot. After being assembled in the interlayer gap of the layered silicon core, the graphene quantum dots having the foregoing quantity of layers not only support the layered silicon core, but also have excellent conductivity. In addition, a lot of interlayer space may remain between the layers of the layered silicon core, to effectively suppress expansion pressure of the negative electrode material during lithium intercalation, and reduce the volume change of the negative electrode material of the battery in the charging and discharging processes.

It should be noted that FIG. 2a to FIG. 2h in the accompanying drawings of this specification of the present invention are schematic sectional views of the electrode material. A person of ordinary skill in the art may know that the electrode material should have a three-dimensional size rather than a two-dimensional size. For example, the electrode material may be presented as a ball, an ellipsoid, a column, or may have another irregular shape. This is not limited in the embodiments of this application. In the structures shown in FIG. 2c, FIG. 2e, FIG. 2f, and FIG. 2g, the graphene quantum dots 20 are not limited to being distributed at locations presented in the schematic sectional views, but may be evenly distributed or unevenly distributed on the outer surface of the layered silicon core 10 having a three-dimensional size.

Embodiment 8

Figure 3:
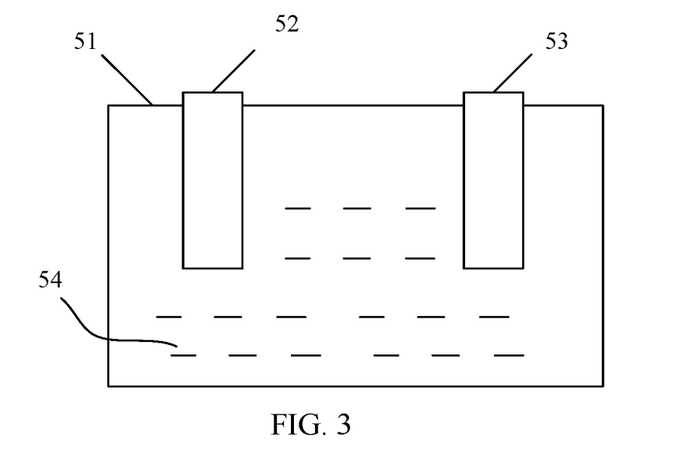
FIG. 3 is a schematic diagram of a battery according to an embodiment of this application.

FIG. 3 shows a battery according to Embodiment 8 of this application. The battery includes a housing 51, a positive electrode 52, a negative electrode 53, and an electrolyte 54.

The positive electrode 52, the negative electrode 53, and the electrolyte 54 are accommodated in the housing 51. When the battery works, the positive electrode 52 releases positive ions, for example, lithium ions; and the lithium ions released by the positive electrode move to the negative electrode 53 through the electrolyte, and are intercalated in a negative electrode material. The negative electrode 53 is prepared based on the electrode material provided in any one of Embodiment 4 to Embodiment 6. Because the negative electrode has a layered silicon core (or a layered silicon core), expansion pressure of the negative electrode material is effectively suppressed during lithium intercalation by using an interlayer gap of the layered silicon core, thereby reducing a volume change of the negative electrode material of the battery in charging and discharging processes, and improving a service life of the negative electrode material of the battery. In addition, graphene quantum dots are filled in the interlayer gap of the layered silicon core. The graphene quantum dots are used to support layers of silicon-based materials to improve strength of the layered silicon core and prevent structural collapse of the layered silicon core after repeated expansion and contraction. Moreover, the graphene quantum dots have superior conductivity, which also helps transmission of electrons and can improve conductivity of the electrode material.

In addition, a person skilled in the art may further know that the battery provided in Embodiment 8 may further include structures such as a diaphragm and an extraction electrode, which are not described in detail in this embodiment of this application.

Obviously, a person skilled in the art can make various modifications and variations to this application without departing from the spirit and scope of this application. This application is intended to cover these modifications and variations to this application provided that they fall within the scope of the claims of this application and their equivalent technologies.

What is claimed is:

1. An electrode material, comprising:
    a layered silicon core, wherein the layered silicon core comprises at least two layers of silicon-based materials, an interlayer gap exists between two neighboring layers of the at least two layers of silicon-based materials, and the silicon-based materials comprise at least one of silicon or an oxide of silicon; and
    a plurality of separate graphene quantum dots, located in the interlayer gap between the at least two layers of silicon-based materials.

2. The electrode material according to claim 1, wherein the graphene quantum dots are further located on an outer surface of the layered silicon core.

3. The electrode material according to claim 1, further comprising:
    a coating layer, coated on an outer surface of the layered silicon core.

4. The electrode material according to claim 3, wherein a material of the coating layer is amorphous carbon.

5. The electrode material according to claim 1, wherein two neighboring layers of the at least two layers of silicon-based materials are at least partially connected.

6. The electrode material according to claim 1, wherein a size of the graphene quantum dot in a plane direction ranges from 1 nanometers (nm) to 60 nm.

7. The electrode material according to claim 1, wherein a quantity of graphene layers in the graphene quantum dot ranges from 1 to 3.

8. A method for preparing an electrode material, comprising:
   making a metal silicide react with a metal removal agent, to generate a layered silicon core from which metal is removed, wherein the layered silicon core comprises at least two layers of silicon-based materials, an interlayer gap exists between two neighboring layers of the at least two layers of silicon-based materials, and the silicon-based materials comprise at least one of silicon or an oxide of silicon; and
   assembling a plurality of separate graphene quantum dots in the interlayer gap of the layered silicon core.

9. The method according to claim 8, further comprising:
   assembling the graphene quantum dots on an outer surface of the layered silicon core.

10. The method according to claim 8, wherein after the assembling graphene quantum dots in the interlayer gap of the layered silicon core, the method further comprises:
    preparing a carbon coating layer on an outer surface of the layered silicon core in which the graphene quantum dots are assembled.

11. The method according to claim 8, wherein the assembling graphene quantum dots in the interlayer gap of the layered silicon core comprises:
    growing the graphene quantum dots in the interlayer gap of the layered silicon core by using a chemical vapor deposition (CVD) process; or
    migrating the graphene quantum dots to the interlayer gap of the layered silicon core.

12. A battery, comprising a positive electrode, an electrolyte, and a negative electrode, wherein the negative electrode is prepared based on an electrode material that comprises:
    a layered silicon core, wherein the layered silicon core comprises at least two layers of silicon-based materials, an interlayer gap exists between two neighboring layers of the at least two layers of silicon-based materials, and the silicon-based materials comprise at least one of silicon or an oxide of silicon; and
    a plurality of separate graphene quantum dots, located in the interlayer gap between the at least two layers of silicon-based materials.

* * * * *